United States Patent [19]

Scari' et al.

[11] Patent Number: 5,752,550

[45] Date of Patent: May 19, 1998

[54] WARPWISE UNIDIRECTIONAL GLASS FABRIC WITH LENO BINDING THREADS

[75] Inventors: Diego A. Scari'; Marco Scari', both of Brugherio, Italy

[73] Assignee: Gividi Italia S.p.A., Milan, Italy

[21] Appl. No.: 768,137

[22] Filed: Dec. 17, 1996

[30] Foreign Application Priority Data

Feb. 8, 1996 [IT] Italy .................. MI96A0237

[51] Int. Cl.$^6$ .................. D03D 15/00; D03D 19/00; H05K 1/03
[52] U.S. Cl. .................. 139/420 C; 428/901; 442/2; 442/219; 442/189; 139/419
[58] Field of Search .................. 428/901, 902, 428/417; 442/2, 219, 189; 139/420 C, 420 A, 383 R, 404, 419, 426 R

[56] References Cited

U.S. PATENT DOCUMENTS

| | | | |
|---|---|---|---|
| 2,679,677 | 6/1954 | Crandall | 442/219 |
| 2,810,405 | 10/1957 | Huau | 139/420 C |
| 3,871,946 | 3/1975 | Romanski et al. | 139/419 |
| 4,320,160 | 3/1982 | Nishimura et al. | 139/420 R |
| 5,110,656 | 5/1992 | Inaba et al. | |
| 5,164,250 | 11/1992 | Rodriguez | |
| 5,244,693 | 9/1993 | Inaba et al. | |
| 5,433,991 | 7/1995 | Boyd, Jr. et al. | 139/420 C |
| 5,476,123 | 12/1995 | Rydin | 139/383 AA |

FOREIGN PATENT DOCUMENTS

| | | |
|---|---|---|
| 0 478 051 | 4/1992 | European Pat. Off. . |
| 1 307 436 | 3/1963 | France . |
| 42 26 208 | 2/1994 | Germany . |
| 4050 78947 | 3/1993 | Japan .................. 139/383 R |
| 87856 | 11/1936 | Sweden .................. 139/383 R |
| 790216 | 2/1958 | United Kingdom . |
| 1082684 | 9/1967 | United Kingdom . |
| 94/02306 | 2/1994 | WIPO . |
| 96/02692 | 2/1996 | WIPO . |

OTHER PUBLICATIONS

Patent Abstracts of Japan, vol. 018, No. 686 (C-1292), Dec. 26, 1994 and JP 06 272134 A (Nippon Muki Co. Ltd.), Sep. 27, 1994.

*Primary Examiner*—Andy Falik
*Attorney, Agent, or Firm*—Griffin, Butler, Whisenhunt & Szipl

[57] ABSTRACT

A unidirectional fabric produced with a continuous glass yarn which is twisted, plied or has zero twisting turns, with different gram weights. Interlacings of thin glass binding yarns for stabilizing the fabric extend warpwise to engage weft yarns in a leno interweaving. The fabric is used in the manufacture of printed circuits and in industrial applications.

5 Claims, 2 Drawing Sheets

WARPWISE UNIDIRECTIONAL GLASS FABRIC WITH LENO BINDING THREADS

The present invention relates to a unidirectional glass fabric produced with continuous yarn which is twisted, plied or has zero twisting turns, with different gram weights and interlaced with thin glass yarns as a stabilizing binding, as well as to use thereof in the manufacture of printed circuits.

BACKGROUND OF THE INVENTION

Glass fabric is used nowadays with success in a wide range of applications. Among the main ones, mention may be made of those applications involving advanced structural composites for the aeronautical and naval industries and dielectric composites for the electrical and electronics industry.

In particular, the Applicant's interest is directed towards the manufacture of glass fabrics for use in the electrical and electronics industry, preferably the construction of laminates for printed circuits and the manufacture of fabrics and gauzes used as a reinforcement in numerous industrial applications.

The miniaturization of electronic devices is giving rise to various assembly problems, including the concentration of tracks on printed circuits and hence the need for making the tracks thinner.

This innovative process has not radically affected the criteria for laminate production, but is requiring the use of glass fabrics which are much more refined than those currently used.

In particular, the weaving industry is having to find solutions for the problems associated with the surface of the fabrics, which need to be increasingly flat and smooth and as far as possible devoid of loose pile and textile defects in general, and with dimensional stability, which must be kept as low as possible.

It is obvious that conventional glass fabric, which constitutes the structural support of the laminate, based on a cloth weave, is no longer suited for tolerating a reduction in these parameters.

Consequently it is necessary to provide a glass fabric with an increasingly higher performance compared to the fabrics currently used.

On account of the increasingly stringent specifications for printed circuits, the person skilled in the art is now having to regard as critical certain aspects of the laminates, such as the surface waviness, dimensional stability, warping, perforability, thickness, dielectric constant, and others, such that it can be said that the characteristics of the laminate depend not only on the resins used, but also on the structure of the glass fabric.

Pure unidirectional glass products used for advanced composites are known. A product of this kind consists of a series of undirectional yarns arranged next to one another. A unidirectional product of this type cannot be used for the manufacture of monolithic glass-reinforced resin laminates employing conventional technology on account of the difficulty in handling the layer of undirectional yarns and in particular the need for a substantial modification in the technique for molding the glass-reinforced resin sheets currently used. In fact, a layer of undirectional yarns held together by epoxy resin would be unable to withstand the standard molding pressures and the yarns, which will move during molding, would cause voids or irregular distribution between glass and resin.

One solution to the problem is illustrated in the Applications EP 0478051 and WO 9402306, both in the name of Akzo, which provide a method for the manufacture of boards for printed circuits reinforced with a unidirectional glass product. These methods involve the use of extremely complex and costly machines.

There is currently the need, therefore, for a glass fabric which is unidirectional as far as possible and can be processed with the technology available, but which is not affected by the aforementioned problems, in particular structural stability, and which is able to produce monolithic laminates which satisfy the requirements for printed circuits.

SUMMARY OF THE INVENTION

It has now been discovered that a unidirectional fabric produced with a continuous glass yarn which is twisted, has a low number of twists or zero twisting turns, with different gram weights and interlaced with thin glass yarns as a binding permits the manufacture of laminates for printed circuits satisfying the requirements imposed by progressive miniaturisation.

Therefore, the present invention relates to a unidirectional fabric produced with continuous glass yarn which is twisted, has a low number of twists or zero twisting turns with different gram weights, characterized in that it is interlaced warpwise with glass yarns of 5.5 to 34 Tex at a spacing of up to 20 cm from each other and with a leno interwoven binding.

The present invention also relates to the use of said glass fabric for the manufacture of laminates for printed circuits, as well as the printed circuits comprising said laminates.

The present invention provides a fabric as a result of which it is possible to obtain monolithic glass-reinforced resin laminates possessing excellent properties for use in the manufacture of printed circuits using conventional techniques and equipment.

This result is obtained owing to the stability of the unidirectional fabric according to the present invention.

BRIEF DESCRIPTION OF THE DRAWINGS

The subject of the present invention, in its various embodiments, and the advantages arising therefrom will be described in the detailed description which follows and with the aid of the drawings in which.

DETAILED DESCRIPTION OF THE INVENTION

Figure 1:
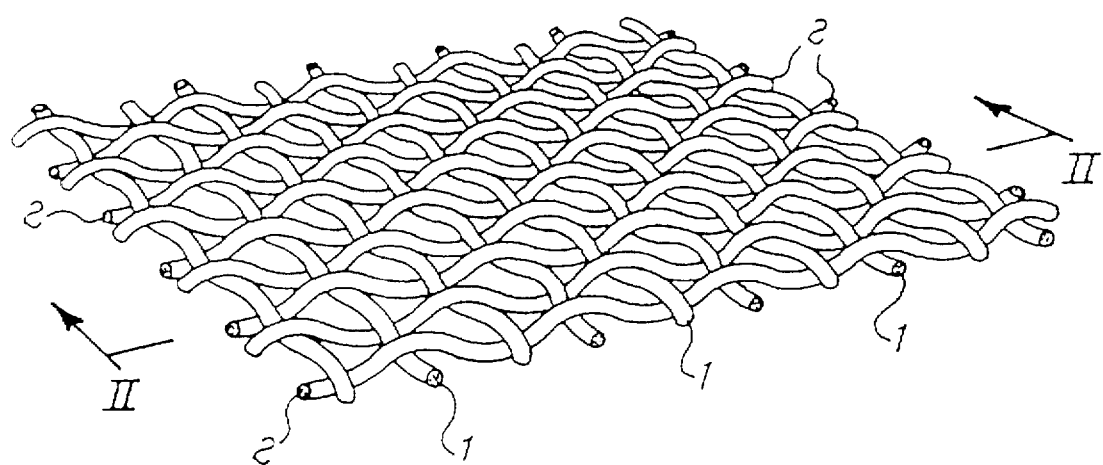
FIG. 1 shows in schematic form an axonometric view of a conventional fabric.
Figure 2:
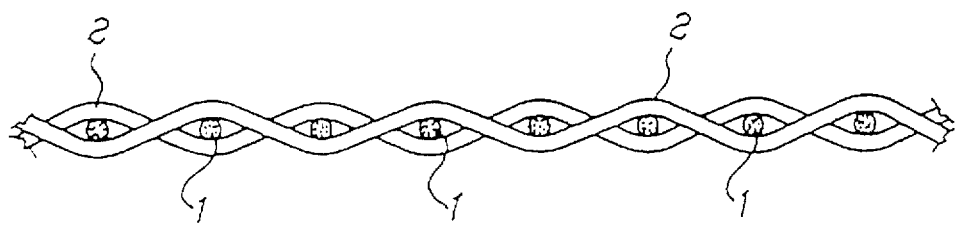
FIG. 2 shows a profile view of the fabric according to FIG. 1, along the section II—II.
Figure 3:
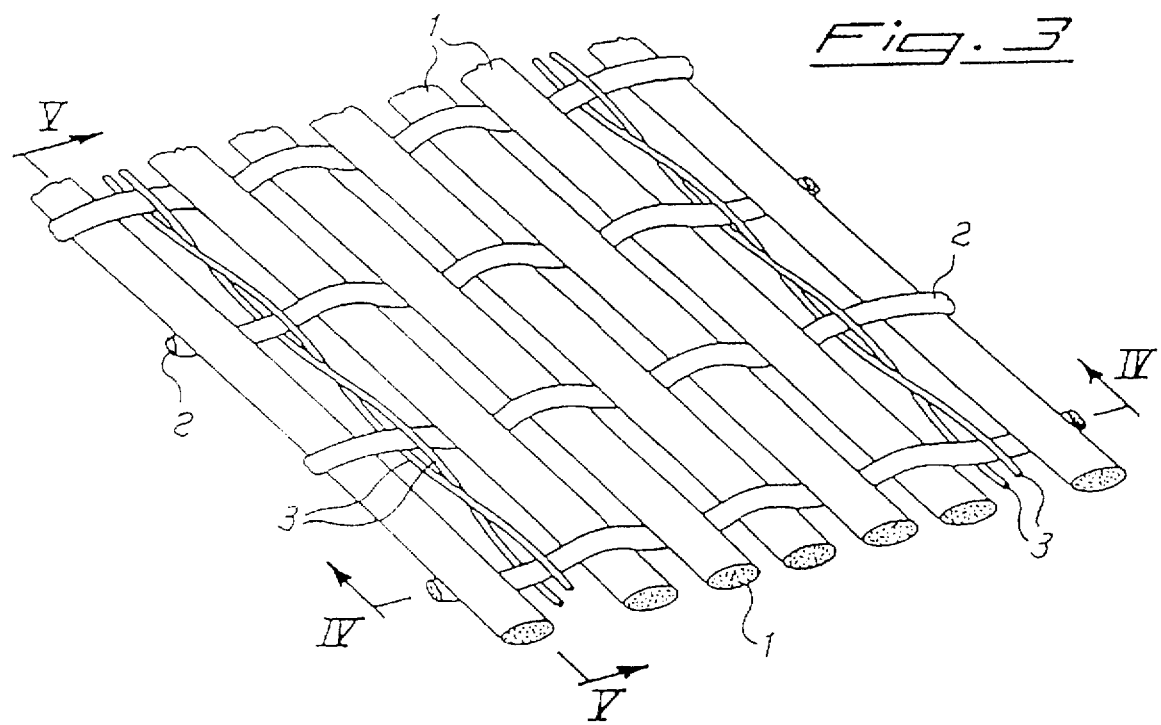
FIG. 3 shows in schematic form an axonometric view of the fabric according to the present invention.
Figure 4:
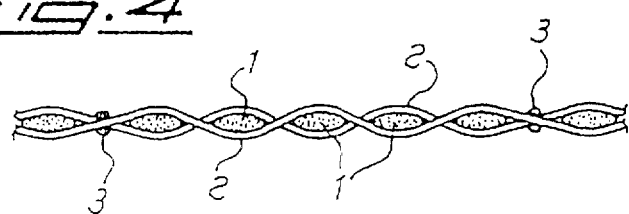
FIG. 4 shows a profile view of the fabric according to FIG. 3 along the section IV—IV.
Figure 5:
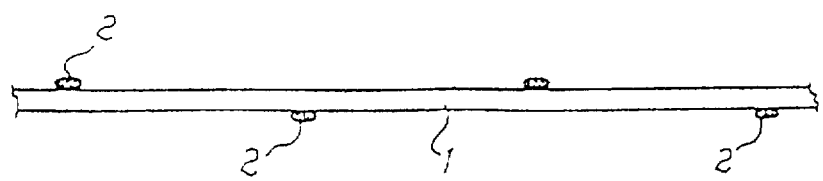
FIG. 5 shows a profile view of the fabric according to FIG. 3 along the section V—V.

In the Figures, the reference (1) denotes the warp yarns, (2) the weft yarns and (3) the binding yarns.

In the fabric according to the present invention, the interlacing warpwise binding yarn is obtained using glass yarns of 5.5 to 22 Tex.

The two binding yarns lie, in pairs, next to the bottom of binding yarns and are not visible on the fabric. In the fabric these yarns (3) are interlaced with the yarns (2), being alternately located on the first weft on the upper right-hand side and on the second weft on the bottom left-hand side, resulting in a binding well known to textile experts by the name of "leno interwoven binding". With insertion of the binding yarns (3) which are referred to as "interlacing", stabilization of the bottom yarns is obtained, which allows handling of the unidirectional fabric without slipping of the yarns which could rise to overtensioning and very severe distortion during the subsequent resin impregnation phase. The yarns with this invention thus remain perfectly aligned with one another and uniformly tensioned, thus avoiding becoming displaced, superimposed or bunched together under the molding pressures occurring in the standard technological process used nowadays and resulting in a uniform resin/glass ratio in the mass of the laminate.

In a first embodiment of the present invention, the unidirectional fabric is composed of yarn arranged warpwise of at least 90% of the total weight of the fabric. In the unidirectional fabric according to the present invention, the weft yarns (2) are considered solely to be bindings of the warp yarns (1).

The interlacings may be arranged at a maximum spacing from one another of 20 cm. In a preferred embodiment a spacing of between 10 and 15 cm and a number of wefts of up to 8 per cm is envisaged.

The yarn which forms the fabric is formed by conventional filaments, preferably with a diameter of between 5 and 13 microns.

In a preferred embodiment, the yarn has a Tex value of between 22 and 136.

A particularly preferred embodiment envisages a unidirectional fabric with a warp having a value of between 22 and 136, preferably 74 Tex, the weft with a value of between 11 and 68, preferably 34 Tex, and the interlacings with a value of between 5 and 34, preferably 11 Tex.

The fabric according to the present invention may be processed perfectly using standard impregnation and molding processes with obvious economic advantages and without the need for investment in new technology.

The laminates made of glass-reinforced resin, for example glass-reinforced epoxy resin, comprising the fabric according to the present invention as the support structure, have very low surface roughness values (Wt), less than 2 µm. By comparison, the roughness values of conventional laminates are 4 µm.

With low roughness of the laminate, further reductions in the dimensions of the printed thin copper tracks become possible, with considerable advantages in terms of the overall performance of the panels, as well as direct application of the thin copper tracks, with major economic and ecological advantages. Using this system, it is possible to achieve savings in copper and eliminate the etching operation performed with toxic acids.

With the present invention it is also possible to obtain dimensional stability values which are at least 60% lower than the current standard values equivalent to 200 ppm.

This is possible owing to the intrinsic linearity of the unidirectional fabric which does not allow, as instead occurs in fabrics with a standard weave, elongations during molding of the laminate and consequent contractions during the ensuing processing stages. With low dimensional stability values, application of the dry film and in general manufacture of the multi-layers may be controlled more easily and therefore achieved in a more efficient and economical manner.

Other advantages obtained with the laminates described above are the uniform perforability of the laminate with an improved perforation quality; greater economy of the perforating operation with savings in terms of the wear of the drilling tips; surface devoid of inclusions and excessive thicknesses which cause thinning of the copper; uniform thickness and composition of the laminate which helps achieve a more uniform "dielectric constant" over the entire printed circuit, in particular for applications involving high frequencies such as those of 3–30 GHz used in telecommunications and satellite applications; greater dimensional stability $D_{stab}$-CTE $\alpha_{x,y}$; smaller number of microscopic voids; longer "measling" resistance times; greater economy during production of the fabric.

The use of the novel unidirectional fabric also gives rise to advantages in connection with the laminate manufacturing process. Since the novel fabric has a wetting time which is 50% less compared to that of a standard fabric, the epoxy resin used during impregnation may be prepared with mixtures which are more viscous and hence contain a smaller quantity of solvent which is to be evaporated; consequently it is possible to achieve a higher working speed with a saving in the amount of solvent used.

Moreover, the unidirectional fabric thus produced is particularly suitable for impregnation with hot-melt formulated resin systems and solvent-free resins, resulting in further savings in solvent, equivalent to nearly 100%, and even faster impregnation speeds.

The present invention also provides a solution to the problem of imperfect cleanliness owing to the presence of the residues of organic compounds, such as starch, used in the weaving process and then removed. The presence of these residues in the laminate alters the chemical and physical properties of the latter. It is obvious that the standard fabrics are very compact and hence very difficult to clean owing to the difficulty which the heat has in penetrating them and hence the difficulty which the distillation vapors of the combusted size have in escaping. On the other hand, the fabric according to the present invention, owing to its greater permeability, allows optimum cleaning without the structure of the fabric being altered during the course of the operation.

We claim:

1. Unidirectional fabric including interwoven continuous glass warp and weft yarn comprising said weft yarn being further interwoven with warpwise leno binding glass yarn of 5 to 34 Tex spaced up to 20 cm from each other and wherein the weight of the warp yarn is at least about 90% of the total fabric weight.

2. Fabric according to claim 1, wherein the glass yarn consists of filaments with a diameter of between 5 and 13 microns.

3. Fabric according to claim 2, wherein the glass yarn has a Tex value of between 22 and 136.

4. Fabric according to claim 1, wherein the warp yarn has a Tex value of between 22 and 136, a weft yarn has a Tex value of between 11 and 68 and the binding glass yarns have a Tex value of between 5.5 and 34.

5. Fabric according to claim 1 for use as a printed circuit laminate.

* * * * *